(12) United States Patent
Suzuki

(10) Patent No.: US 7,662,432 B2
(45) Date of Patent: Feb. 16, 2010

(54) PATTERN FORMATION METHOD

(75) Inventor: Katsumi Suzuki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/964,272

(22) Filed: Dec. 26, 2007

(65) Prior Publication Data

US 2008/0175981 A1 Jul. 24, 2008

(30) Foreign Application Priority Data

Jan. 18, 2007 (JP) ............................. 2007-008844

(51) Int. Cl.
*B05D 5/06* (2006.01)
*B05D 5/12* (2006.01)

(52) U.S. Cl. .................. 427/162; 427/58; 427/256

(58) Field of Classification Search .............. 427/58, 427/256, 162
See application file for complete search history.

(56) References Cited

U.S. PATENT DOCUMENTS

| | | | |
|---|---|---|---|
| 6,476,988 B1 | 11/2002 | Yudasaka | |
| 6,599,582 B2 * | 7/2003 | Kiguchi et al. | 427/466 |
| 7,222,956 B2 | 5/2007 | Yokouchi et al. | |
| 2006/0110847 A1 * | 5/2006 | Fujimori et al. | 438/99 |
| 2006/0113284 A1 | 6/2006 | Umetsu | |
| 2006/0115598 A1 | 6/2006 | Kaneko et al. | |
| 2006/0158482 A1 | 7/2006 | Nakamura et al. | |
| 2006/0163743 A1 | 7/2006 | Kuwabara et al. | |
| 2007/0046718 A1 * | 3/2007 | Shintate et al. | 347/21 |

FOREIGN PATENT DOCUMENTS

| | | | |
|---|---|---|---|
| EP | 1672413 A1 * | 6/2006 | |
| GB | 2140850 A * | 12/1984 | |
| JP | 09073010 A * | 3/1997 | |
| JP | H11-207959 A | 8/1999 | |
| JP | H11-271753 A | 10/1999 | |
| JP | 2000-250027 A | 9/2000 | |
| JP | 2004-031077 A | 1/2004 | |
| JP | 2004-246109 A | 9/2004 | |
| JP | 2006-091053 A | 4/2006 | |
| JP | 2006-135090 A | 5/2006 | |
| JP | 2006-178208 A | 7/2006 | |
| JP | 2006-199023 A | 8/2006 | |
| JP | 2006-229212 A | 8/2006 | |
| JP | 2007-42720 A | 2/2007 | |
| WO | WO-2004/097915 A1 | 11/2004 | |

* cited by examiner

*Primary Examiner*—Roberts Culbert
(74) *Attorney, Agent, or Firm*—Global IP Counselors, LLP

(57) ABSTRACT

A pattern formation method includes forming a plurality of concave parts adjacent to each other on a substrate, and discharging droplets including a functional liquid material on the substrate to form a prescribed pattern of the functional liquid material that straddles over the concave parts on the substrate.

9 Claims, 10 Drawing Sheets

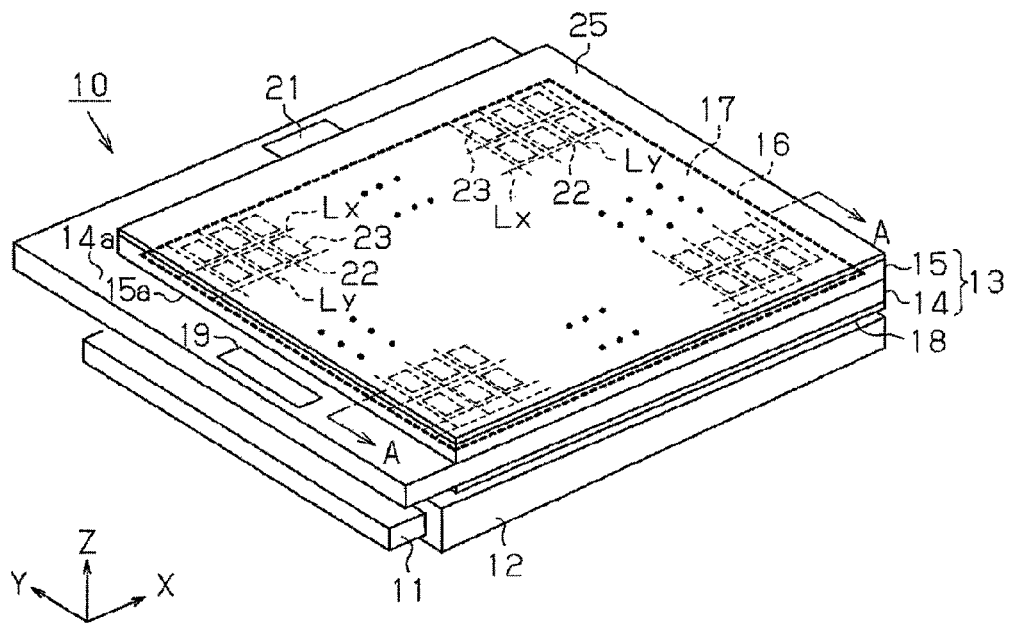
F I G. 1
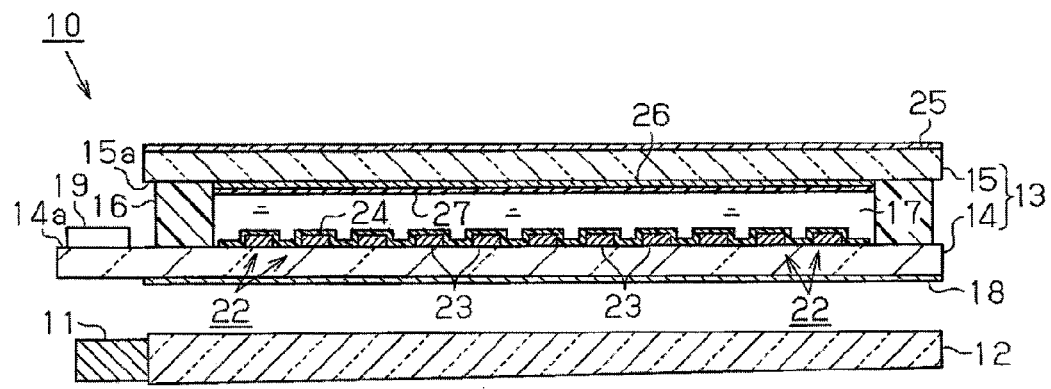
F I G. 2

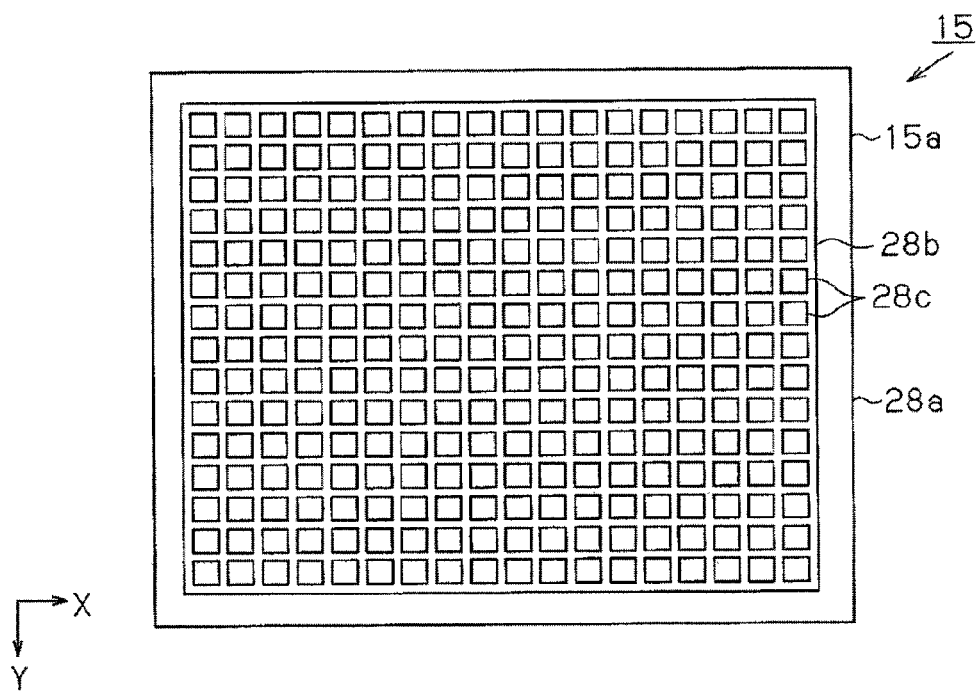
F I G. 3
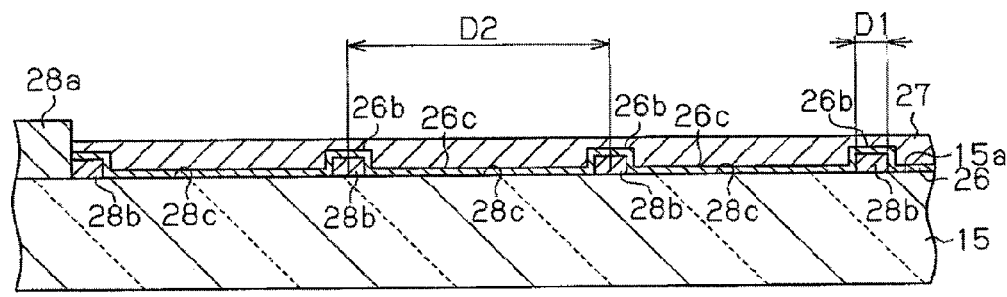
F I G. 4

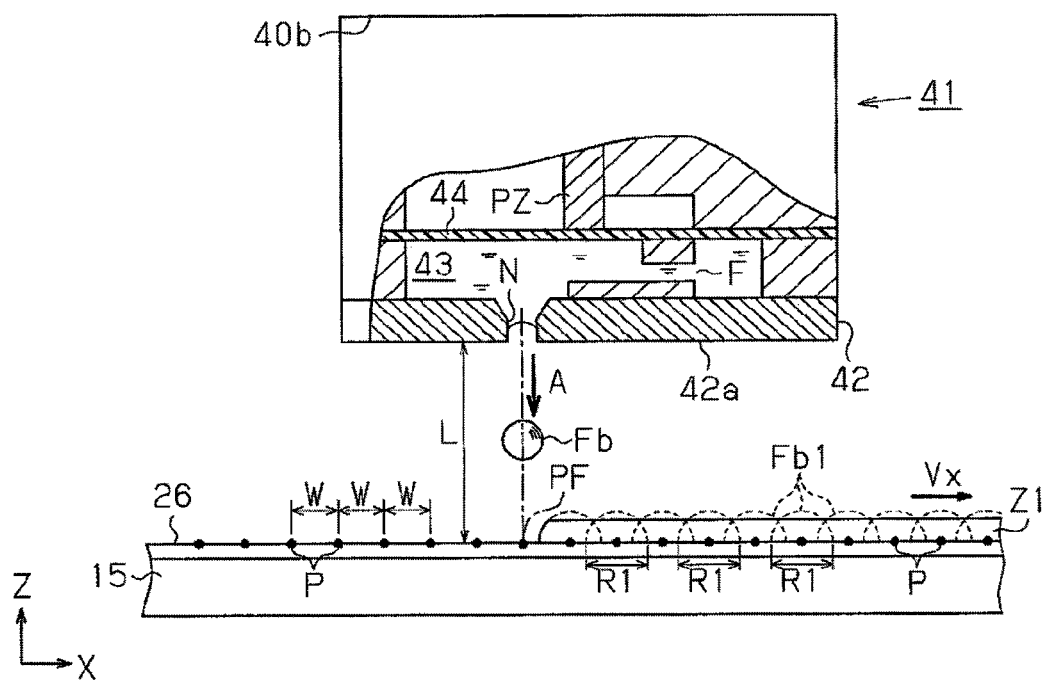
F I G. 7

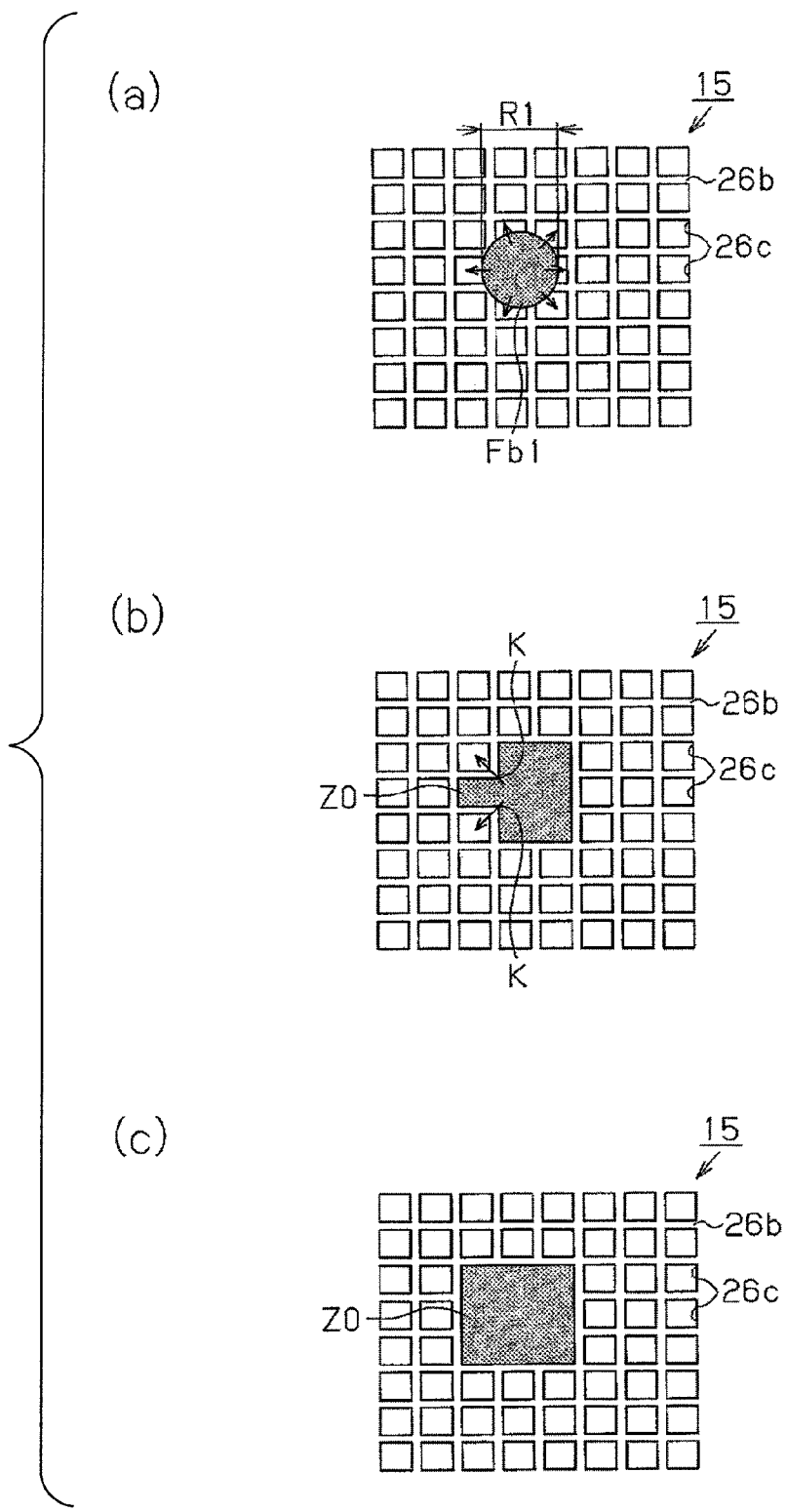
F I G. 8

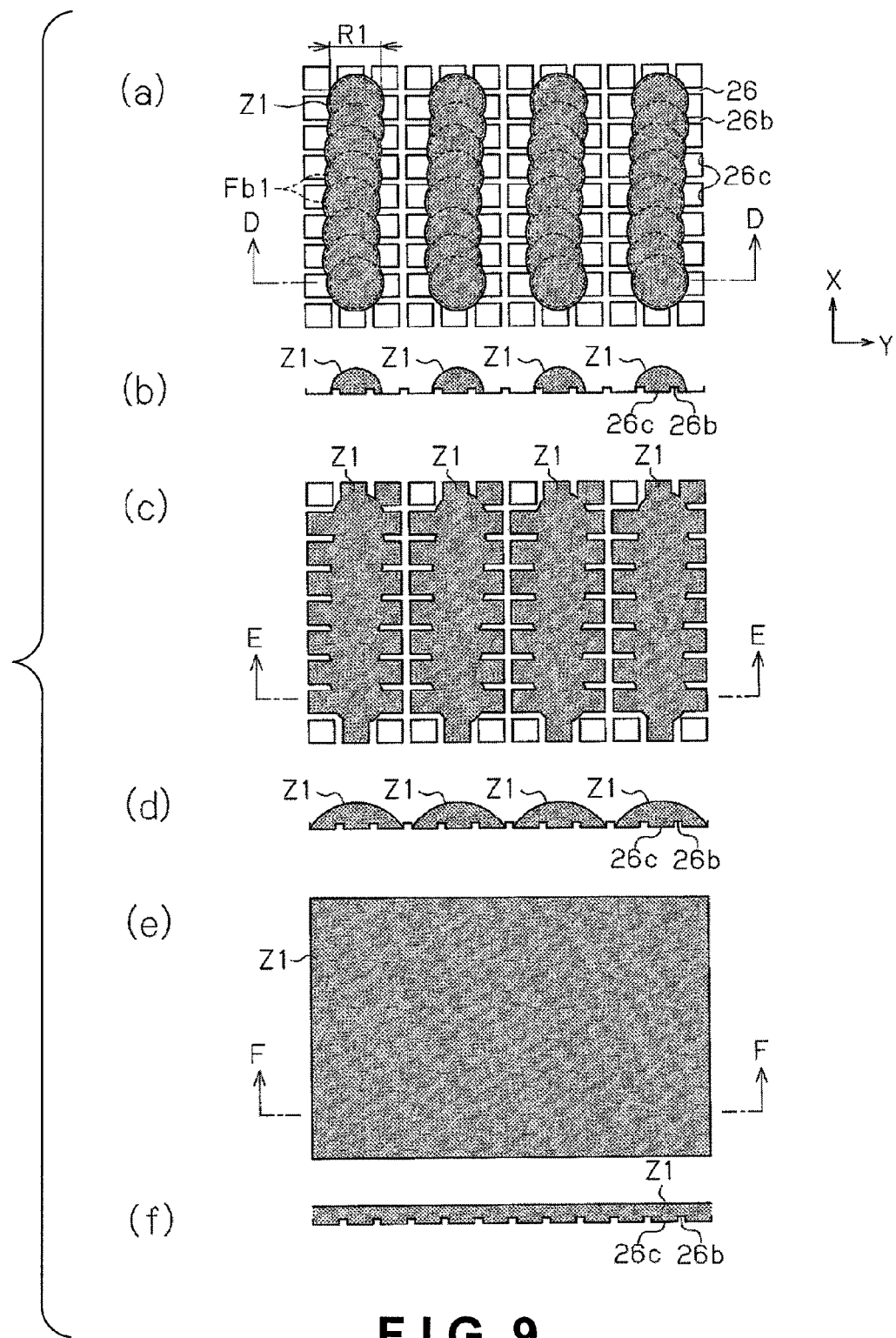
F I G. 9

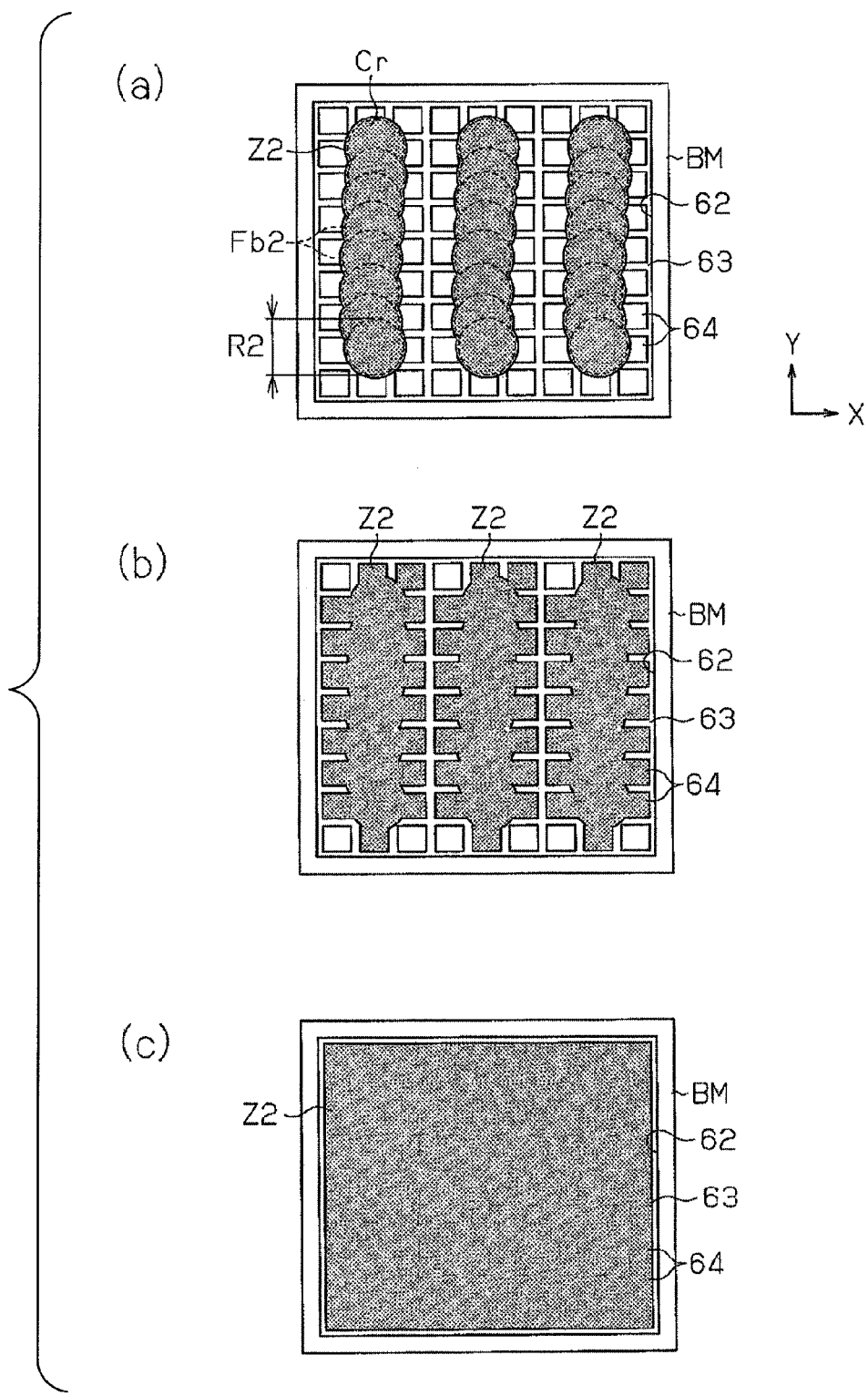
F I G. 13

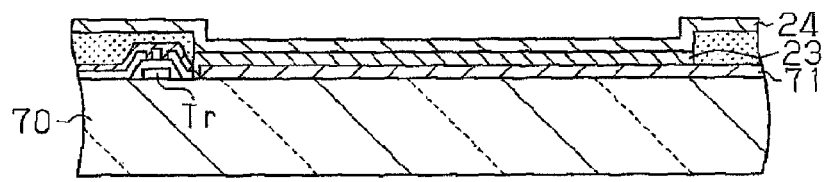
F I G. 14
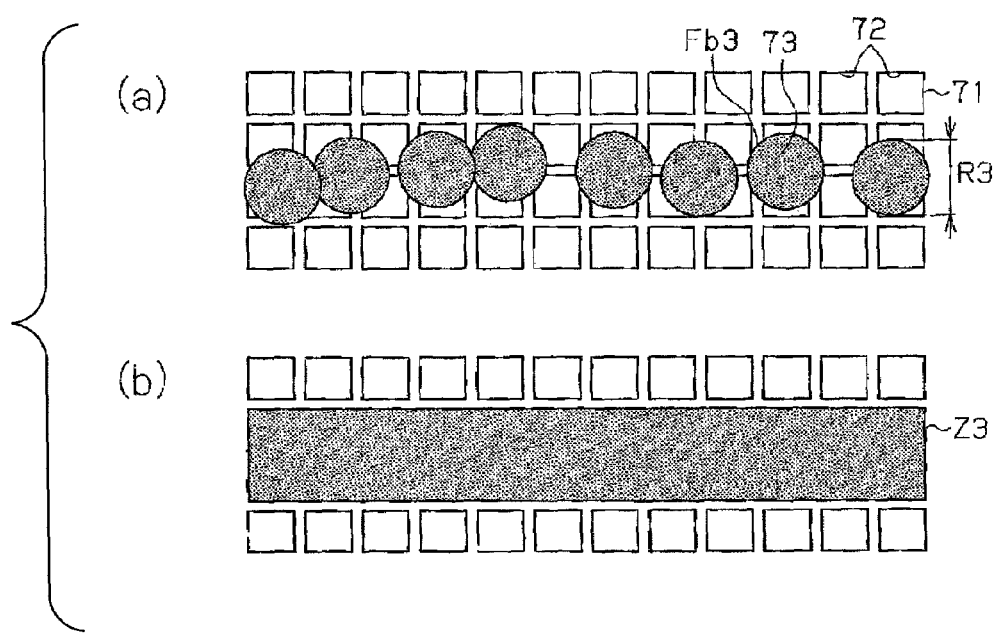
F I G. 15

PATTERN FORMATION METHOD

CROSS-REFERENCE TO RELATED APPLICATIONS

This application claims priority to Japanese Patent Application No. 2007-008844 filed on Jan. 18, 2007. The entire disclosure of Japanese Patent Application No. 2007-008844 is hereby incorporated herein by reference.

BACKGROUND

1. Technical Field

The present invention relates to a pattern formation method.

2. Related Art

In a liquid crystal display device, liquid crystals are sealed between an element substrate and an opposing substrate via a seal member. Orientation films for orienting the liquid crystal are formed on the surfaces of the element substrate and the opposing substrate that are adjacent to the liquid crystal. The orientation films are formed on substantially the entire surfaces of the element substrate and the opposing substrate, and an inkjet method is included as one method for forming the orientation films. In the inkjet method, droplets discharged on a substrate are allowed to coalesce with each other to form an orientation film pattern on the substrate. However, the droplets discharged on the substrate sometimes do not spread uniformly on the substrate. For example, the droplets contract and form stripes, droplets are attracted by other droplets and form bulges, and other problems occur, and a uniform orientation film is difficult to form.

Therefore, a method has been proposed for suitably arranging the droplets discharged from a droplet discharge device so that unfilled parts do not occur in a range that is surrounded by a bank (barrier) (see, Japanese Laid-Open Patent Application Publication No. 2004-31077). In this publication, droplets of a luminescent thin-film material are discharged from an inkjet nozzle two at a time at a discharge interval of two seconds or less into regions that are partitioned by barriers on a pixel electrode formed on a glass substrate, the droplets are dried, and a luminescent thin-film layer is formed. The droplet discharge interval is set to two seconds or less, whereby droplets are attracted by previously discharged and dried droplets, and lack of spreading of the droplets within the banks is prevented as a result. However, the technique disclosed in this publication cannot be applied to a case in which droplets are uniformly spread in a wide range.

Therefore, a method has been proposed for discharging a plurality of droplets from a droplet discharge device and arranging the droplets in the ranges surrounded by the banks without allowing unfilled portions to occur (Japanese Laid-Open Patent Application Publication No. 2006-178208). In this publication, droplets are discharged near the corner parts in the corner parts of the banks in the portions surrounded by the banks, the interval between discharged droplets is reduced towards the center of the portions surrounded by the banks, and droplets are discharged in the center portion near the center. The height of the droplets when the discharged droplets are adjacent to the banks is thereby made substantially uniform in all locations, liquid is prevented from leaking from the banks, and the droplets are uniformly arranged in the portions surrounded by the banks.

In view of the above, it will be apparent to those skilled in the art from this disclosure that there exists a need for an improved pattern formation method. This invention addresses this need in the art as well as other needs, which will become apparent to those skilled in the art from this disclosure.

SUMMARY

However, in Japanese Laid-Open Patent Application Publication No. 2006-178208, the discharge positions of the droplets must be accurate, and the discharge method is complex. The technique is also difficult to apply to cases in which droplets are spread in a wide range in which time is required for discharge.

The present invention was developed to overcome the abovementioned drawbacks, and an object of the present invention is to provide a pattern formation method for easily forming an accurate pattern on a substrate by forming concave parts in a matrix in partitioned fashion on a substrate, and arranging and spreading droplets in appropriately selected concave parts.

The pattern formation method of the first aspect of the present invention includes forming a plurality of concave parts adjacent to each other on a substrate, and discharging droplets including a functional liquid material on the substrate to form a prescribed pattern of the functional liquid material that straddles over the concave parts on the substrate.

According to the pattern formation method of the first aspect of the present invention, the droplets arranged on the substrate are arranged so as to overlap the plurality of concave parts, and the shape of the edge portions of the pattern formed by the droplets is restricted by the shape of the concave parts. Consequently, a pattern can be formed that has an accurate shape restricted by the shape of the concave parts by the droplets that are discharged on the substrate.

Even when the droplets for forming the pattern land with low precision on the substrate, the droplets spread in the shape of the concave parts, and are restricted when at least a portion of the droplets overlap in the desired concave parts. Defects due to poor landing precision of the discharged droplets on the substrate can therefore be reduced. Since high droplet discharge precision is not required in the droplet discharge unit, the structure or system of the droplet discharge unit can be simplified.

It is preferred in the pattern formation method that the plurality of concave parts be partitioned and formed in a matrix.

According to this pattern formation method, since the concave parts are partitioned and formed in a matrix, a concave part for discharge of droplets can be selected by the droplet discharge device. Accordingly, a pattern can be formed in any shape by discharging droplets having a small liquid volume in a selected concave part. As a result, there is no need to form a pattern having a prescribed shape in advance on the substrate, and pattern formation on the substrate is simplified.

When droplets having a small liquid volume are discharged in a selected concave part, the discharged droplets can be suitably spread along the concave parts on the substrate. As a result, a liquid layer of the functional liquid material can be suitably formed on the substrate.

The partitioning and forming of the concave parts in a matrix also makes the concave parts easy to form.

In this pattern formation method, the droplets may be discharged so that droplets previously discharged on the substrate are at least partially overlapped.

According to this pattern formation method, at least a portion of the discharged droplets overlap with other droplets. Consequently, the droplets make contact and coalesce with each other, and a large liquid layer can be created. As a result, the functional liquid material can be widely spread on the substrate, and a thick layer of the functional liquid material can be formed on the substrate.

In this pattern formation method, the droplets may be discharged so that at least a portion of the droplets separately discharged is arranged in the concave parts in which the droplets discharged on the substrate are arranged.

According to this pattern formation method, separately discharged droplets are arranged in concave parts in which already-discharged droplets are spreading. Consequently, previously discharged droplets and droplets that are subsequently discharged can be caused to make contact and coalesce with each other. As a result, a pattern composed of the functional liquid material can be formed by the droplets discharged on the substrate.

In this pattern formation method, the concave parts may be hydrophilic with respect to the functional liquid material.

According to this pattern formation method, since the concave parts are hydrophilic with respect to the functional liquid material, the droplets can appropriately spread in the concave parts.

This pattern formation method may be configured so that the concave parts are provided with convex parts between the adjacent concave parts, and the convex parts are hydrophobic with respect to the functional liquid material.

According to this pattern formation method, since the convex parts are hydrophobic with respect to the functional liquid material, the droplets can easily be retained within the ranges in which the concave parts are formed. A layer of the functional liquid material can therefore be suitably formed in the concave parts.

This pattern formation method may be configured so that the functional liquid material is a liquid material that includes an oriented polymer for forming an orientation film, and the substrate is an element substrate or an opposing substrate of a liquid crystal display device.

According to this pattern formation method, the droplets that include an oriented polymer that are discharged from the droplet discharge unit can suitably spread in an element substrate or opposing substrate in which concave parts are formed. A suitable orientation film can therefore be formed on the element substrate or the opposing substrate.

This pattern formation method may be configured so that the functional liquid material is a liquid material that includes a color material for forming a color filter, and the substrate is an opposing substrate of a liquid crystal display device.

According to this pattern formation method, the droplets that include a color material that are discharged from the droplet discharge unit can suitably spread in an opposing substrate in which concave parts are formed. A suitable color filter can therefore be formed on the opposing substrate.

The pattern formation method may be configured so that the functional liquid material is a liquid material that includes metal particles for forming conductive wiring, and the substrate is an element substrate or an opposing substrate of a liquid crystal display device.

According to this pattern formation method, the droplets that include metal particles and are discharged from the droplet discharge unit spread in the proper pattern on an element substrate or opposing substrate in which concave parts are formed. Conductive wiring can therefore be formed in the proper pattern on the element substrate or the opposing substrate.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 1 is a perspective view showing the liquid crystal display device;

FIG. 2 is a sectional view along line A-A in FIG. 1 showing the liquid crystal display device;

FIG. 3 is a plan view showing the opposing substrate of the first embodiment;

FIG. 4 is a sectional view showing the opposing substrate of the first embodiment;

FIG. 7 is a side view showing the droplet discharge head;

FIG. 8 includes a series of diagrams showing the spreading of a single droplet, wherein (a) is a plan view showing the state in which the droplet is landed; (b) is a plan view showing the state in which the droplet landed in the concave part spreads out; and (c) is a plan view showing the state in which the droplet spreads until stabilizing;

FIG. 9 includes a series of diagrams showing the spreading of a plurality of overlapping droplets on the opposing substrate of the first embodiment, wherein (a) is a plan view showing the state in which the droplets are landed; (b) is a sectional view along line D-D in (a); (c) is a plan view showing the state in which the droplets landed in the concave parts spread out; (d) is a sectional view along line E-E in (c); (e) is a plan view showing the state in which the droplets spread until stabilizing; and (f) is a sectional view along line F-F in (e);

FIG. 13 includes a series of diagrams showing the spreading of a plurality of overlapping droplets on the opposing substrate of the second embodiment, wherein (a) is a plan view showing the state in which the droplets are landed; (b) is a plan view showing the state in which the droplets landed in the concave parts spread out; and (c) is a plan view showing the state in which the droplets spread until stabilizing;

FIG. 14 is a sectional view showing the element substrate of the third embodiment; and FIG. 15 includes a pair of diagrams showing the spreading of droplets discharged on the element substrate, wherein (a) is a plan view showing the state in which the droplets are landed; and (b) is a plan view showing the state in which the droplets spread until stabilizing.

DETAILED DESCRIPTION OF EXEMPLARY EMBODIMENTS

First Embodiment

Figure 5:
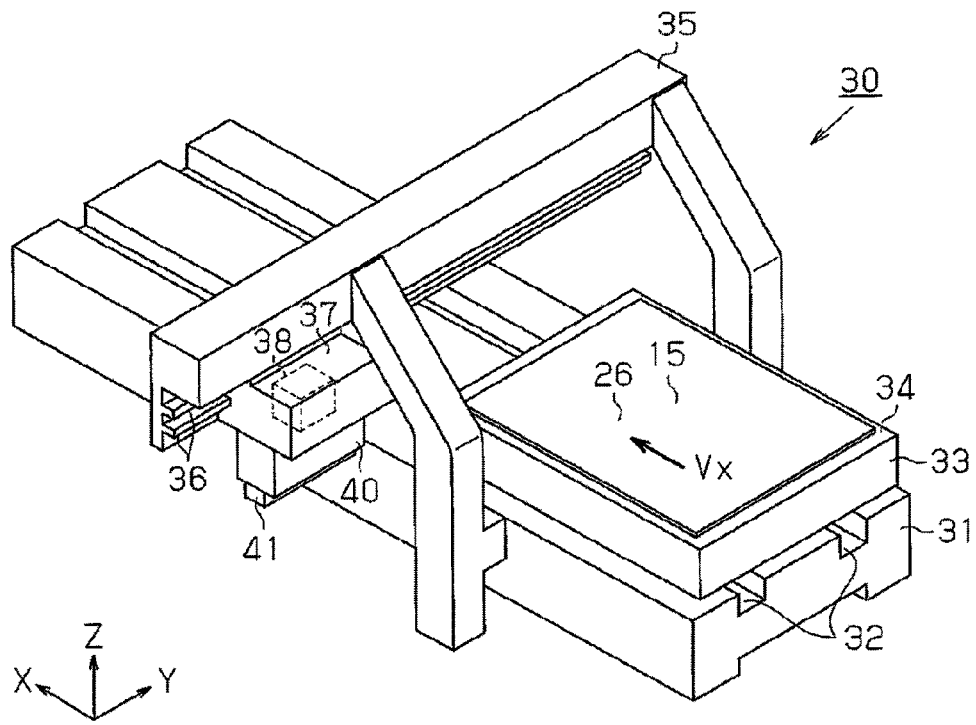
FIG. 5 is a perspective view showing the droplet discharge device.

The first embodiment as a specific implementation of the present invention will be described hereinafter according to FIGS. 1 through 10. A liquid crystal display device 10 having an orientation film formed by the pattern formation method of the present invention will first be described. FIG. 1 is a perspective view showing the liquid crystal display device 10, and FIG. 2 is a sectional view along line A-A in FIG. 1.

In FIG. 1, an edge-light-type backlight 12 formed in a square plate shape having an LED or other light source 11 is provided to the lower side of the liquid crystal display device 10. A square plate-shaped liquid crystal panel 13 formed substantially the same size as the backlight 12 is provided above the backlight 12. The light emitted from the light source 11 is emitted towards the liquid crystal panel 13.

An element substrate 14 and an opposing substrate 15 that face each other are provided to the liquid crystal panel 13. As shown in FIG. 2, the element substrate 14 and the opposing substrate 15 are affixed together via a square frame-shaped seal member 16 composed of a photo-curing resin. Liquid crystal 17 is sealed in the space between the element substrate 14 and the opposing substrate 15.

A polarizing plate, a phase difference plate, or other optical substrate 18 is affixed to the lower surface (surface on the side facing the backlight 12) of the element substrate 14. The optical substrate 18 linearly polarizes the light from the backlight 12 and emits the linearly polarized light to the liquid crystal 17. A plurality of scan lines Lx extending substantially along the entire width in one direction (direction indicated by the arrow X) is arranged and formed on the upper surface (surface on the side facing the opposing substrate 15: element formation surface 14a) of the element substrate 14. The scan lines Lx are each electrically connected to a scan line drive circuit 19 that is disposed on one side of the element substrate 14, and scan signals from the scan line drive circuit 19 are inputted at a prescribed timing. A plurality of data lines Ly extending along substantially the entire width in the direction indicated by the arrow Y is arranged and formed in the element formation surface 14a. The data lines Ly are each electrically connected to a data line drive circuit 21 disposed on the other side of the element substrate 14, and data signals based on display data from the data line drive circuit 21 are inputted at a prescribed timing. A plurality of pixels 22 arranged in a matrix is formed, and is connected to corresponding scan lines Lx and data lines Ly in the positions where the scan lines Lx and the data lines Ly intersect on the element formation surface 14a. A TFT or other control element not shown in the drawing, and a light-transmitting pixel electrode 23 composed of a transparent conductive film or the like are provided to each of the pixels 22.

In FIG. 2, an orientation film 24 in which a rubbing treatment or other orientation treatment is performed is layered on the entirety of each pixel 22. The orientation films 24 are in a thin-film pattern composed of an oriented polyimide or other oriented polymer, and are configured so as to set the orientation of the liquid crystal 17 to a prescribed orientation in the vicinity of the corresponding pixel electrode 23. The orientation films 24 are formed by an inkjet method. Specifically, the orientation films 24 are formed by a process in which an orientation film formation material F (see FIG. 7) as a functional liquid material in which an oriented polymer is dissolved in a prescribed solvent is discharged in the form of droplets Fb (see FIG. 7) on the entire upper side of each pixel 22, and the landed droplets Fb are dried.

A polarizing plate 25 for emitting linearly polarized light that is orthogonal to the light from the optical substrate 18 to the outside (upward in FIG. 2) is provided to the upper surface of the opposing substrate 15. A square frame-shaped barrier (hereinafter referred to as a frame-shaped barrier) 28a and barriers (hereinafter referred to as latticed barriers) 28b in the portion surrounded by the frame-shaped barrier 28a are formed on the lower surface (surface on the side facing the element substrate 14) of the opposing substrate 15, as shown in FIG. 3.

The frame-shaped barrier 28a and the latticed barriers 28b are formed from the same material. In the present embodiment, the barriers are formed by a light-transmitting resin composed of polyimide resin, acrylic resin, or the like, and are hydrophilic with respect to the orientation film formation material F.

The height of the latticed barriers 28b is less than that of the frame-shaped barrier 28a, and is about 100 nanometers. The width D1 of the latticed barriers 28b is one to two micrometers. Furthermore, the interval D2 between the latticed barriers 28b arranged parallel to each other in the X-arrow direction or the Y-arrow direction is the distance obtained by adding the width D1 of the latticed barriers 28b to ten micrometers.

A square first concave part 28c having the opposing substrate 15 as the base part thereof is formed in each of the portions surrounded by the latticed barriers 28b. Each first concave part 28c is formed in a position facing the corresponding pixel electrode 23 thereof when the element substrate 14 and the opposing substrate 15 are affixed together.

The lengths of the four sides of the first concave part 28c are each about 10 micrometers, and the depth of the first concave part 28c is substantially the same as the height of the latticed barriers 28b (about 100 nanometers). In other words, the volume (capacity C1) of each first concave part 28c is approximately ten times ten to the minus eighteenth square meters, i.e., 0.01 picoliter.

On the lower surface of the opposing substrate 15 on which the frame-shaped barrier 28a and the latticed barriers 28b are formed, an opposing electrode 26 composed of a light-transmitting conductive film is layered so as to face each pixel electrode 23, as shown in FIG. 4.

The opposing electrode 26 is formed by sputtering or another method on the surface of the opposing substrate 15 that is provided with an uneven surface due to the latticed barriers 28b and the first concave parts 28c. The thickness of the opposing electrode 26 layered by sputtering is substantially constant on the entire surface. Therefore, an uneven surface is formed by the latticed barriers 28b and the first concave parts 28c on the surface of the opposing electrode 26. In other words, convex parts 26b are formed in the portions that correspond to the latticed barriers 28b, and second concave parts 26c are formed in the portions that correspond to the first concave parts 28c on the surface of the opposing electrode 26. The volume (capacity C2) of the second concave parts 26c at this time is approximately 0.01 picoliter, which is substantially the same as the capacity C1.

In FIG. 2, the opposing electrode 26 is electrically connected to the data line drive circuit 21, and a prescribed common potential from the data line drive circuit 21 is applied to the opposing electrode 26. An orientation film 27 in which a rubbing treatment or other orientation treatment is performed is layered on the entire lower surface (on the upper side in FIG. 4) of the opposing electrode 26. The orientation film 27 is formed by an inkjet method, the same as the orientation film 24, and is configured so as to set the orientation of the liquid crystal 17 to a prescribed orientation in the vicinity of the opposing electrode 26.

The scan lines Lx are selected one at a time at a prescribed timing on the basis of line-sequential scanning, and the control element of each pixel 22 is set to the ON state only during a selected period. A data signal based on display data from the corresponding data line Ly is then outputted to the pixel electrode 23 that corresponds to each control element. When data signals are outputted to the pixel electrodes 23, the orientation state of the corresponding liquid crystal 17 is modulated based on the potential difference between each pixel electrode 23 and the opposing electrode 26. Specifically, the polarization state of the light from the optical substrate 18 is modulated for each pixel 22. An image based on the display data is displayed on the upper side of the liquid crystal panel 13 according to whether the modulated light is transmitted through the polarizing plate 25.

The droplet discharge device 30 as the droplet discharge unit for forming the orientation film 27 will next be described according to FIGS. 5 through 7.

In the droplet discharge device 30 shown in FIG. 5, a base 31 formed in a rectangular shape is provided, and a pair of guide grooves 32 extending along the longitudinal direction (X-arrow direction) is formed on the upper surface of the base 31. A substrate stage 33 as a movement unit that is drivably connected to the output shaft of an X-axis motor MX (shown on the upper left of FIG. 10) provided to the base 31 is provided above the base 31, and the substrate stage 33 is configured so as to move back and forth (scan in the X-arrow direction) in the X-arrow direction and the minus X-arrow direction at a prescribed speed (conveyance speed Vx) along the guide grooves 32.

A mounting surface 34 for enabling the opposing substrate 15 for which the opposing electrode 26 is facing upward to be mounted is formed on the upper surface of the substrate stage 33, and the mounting surface 34 fixes the mounted opposing substrate 15 in position in relation to the substrate stage 33. In the present embodiment, a configuration is adopted in which the opposing substrate 15 is mounted on the mounting surface 34, but this configuration is not limiting, and the element substrate 14 for which the pixel electrodes 23 are facing upward may also be mounted. Substrates of various sizes can be fixed in position on the mounting surface 34.

A guide member 35 formed in a portal shape is provided on both sides of the base 31 in the Y-arrow direction, and a pair of upper and lower guide rails 36 extending in the Y-arrow direction is formed in the guide member 35. The guide member 35 is provided with a carriage 37 that is drivably connected to the output shaft of a Y-axis motor MY (shown on the lower left of FIG. 10) provided to the guide member 35, and the carriage 37 moves back and forth (scans along the Y-arrow direction) in the Y-arrow direction and the minus Y-arrow direction along the guide rails 36. An ink tank 38 for accommodating the orientation film formation material F (see FIG. 7) so as to enable the orientation film formation material F to be conducted is provided inside the carriage 37, and the orientation film formation material F accommodated by the ink tank 38 is conducted to a droplet discharge head 41 that is mounted below the carriage 37.

Figure 6:
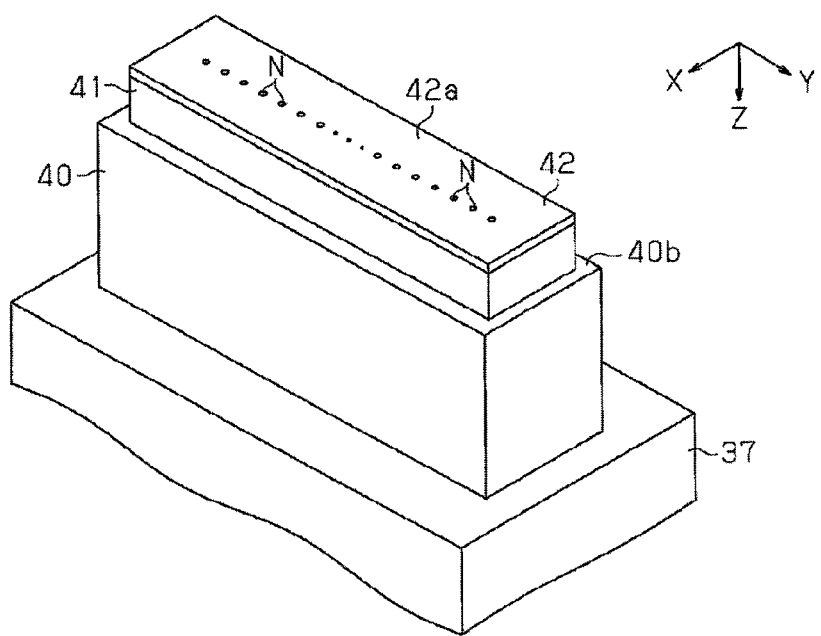
FIG. 6 is a perspective view showing the droplet discharge head.

FIG. 6 is a schematic perspective view showing the carriage 37 (droplet discharge head 41) as viewed from below (the opposing substrate 15 side), and FIG. 7 is a schematic side view showing the droplet discharge head 41 as viewed from the Y-arrow direction.

In FIG. 6, a rectangular-shaped housing 40 that extends in the Y-arrow direction is provided on the lower side (upper side in FIG. 6) of the carriage 37, and the droplet discharge head 41 (hereinafter referred to simply as the discharge head) formed in a rectangular shape extending in the Y-arrow direction is provided to an attachment surface 40b. A nozzle plate 42 is provided on the lower side (upper side in FIG. 6) of the droplet discharge head 41, and a nozzle formation surface 42a parallel to the attachment surface 40b is formed on the side of the nozzle plate 42 that faces the opposing substrate 15 (the upper side in FIG. 6). A plurality of nozzles N as discharge openings is arranged and formed at an equal pitch along the Y-arrow direction in the nozzle formation surface 42a.

In FIG. 7, the nozzles N are formed so as to lead through the nozzle plate 42 along the direction of the line normal to the nozzle formation surface 42a (attachment surface 40b), i.e., along the discharge direction A. In the present embodiment, the position that corresponds to each nozzle N in the discharge direction A is referred to as a landing position PF.

A cavity 43 communicated with the ink tank 38 is formed on the opposite side in the discharge direction A of each nozzle N, and the orientation film formation material F from the ink tank 38 is fed to the corresponding nozzle N. An oscillating plate 44 capable of oscillating in the discharge direction A and the opposite direction is affixed on the opposite side of the cavity 43 in the discharge direction A, and the oscillating plate 44 varies the volume inside the cavity 43. A plurality of piezoelectric elements PZ corresponding to the nozzles N is provided above the oscillating plate 44. The piezoelectric elements PZ receive a signal (piezoelectric element drive signal COM: shown on the lower left of FIG. 10) for the drive control of each piezoelectric element PZ, and undergo contraction and expansion, and the corresponding oscillating plate 44 is oscillated in the discharge direction A and the opposite direction.

On the opposing electrode 26 (opposing substrate 15), lattice points (hereinafter referred to as "target positions P") for landing a droplet Fb are set at equal intervals (discharge interval W) along the X-arrow direction in the region (within the frame-shaped barrier 28a) for forming the orientation film 27. The substrate stage 33 is transported in the X-arrow direction, and the piezoelectric element drive signal COM is fed to each piezoelectric element PZ at the times at which the target positions P pass directly under the nozzles N of the droplet discharge head 41.

The volume of each cavity 43 is then varied, and the meniscus (interface of the orientation film formation material F) in each nozzle N oscillates. When the meniscus in each nozzle N oscillates, a prescribed weight of the orientation film formation material F according to the piezoelectric element drive signal COM is discharged from the corresponding nozzle N as a droplet Fb having a prescribed diameter, i.e., a prescribed liquid quantity. The discharged droplets Fb travel a flight distance L in the discharge direction A, and eventually land in the regions of the target positions P (landing positions PF) on the opposing electrode 26. In the present embodiment, the prescribed liquid quantity of a droplet Fb is the quantity whereby a droplet Fb landed on the opposing electrode 26 spreads in the plurality of second concave parts 26c, and is set, for example, to 10 picoliters, which is 1000 times the capacity C2 of the second concave parts 26c.

The piezoelectric element drive signal COM of the present embodiment is generated based on waveform data WD (see FIG. 10) that are set on the basis of advance testing and the like, and is set so that the meniscus is smoothly oscillated, and the weight of the droplets Fb is stabilized at a prescribed weight. Specifically, the droplet discharge device 30 of the present embodiment discharges the droplets Fb according to a common piezoelectric element drive signal COM (waveform data WD), and stabilizes the external diameter, i.e., the discharged liquid quantity, of each droplet Fb.

The electrical configuration of the droplet discharge device 30 configured as described above will next be described according to FIG. 10.

Figure 10:
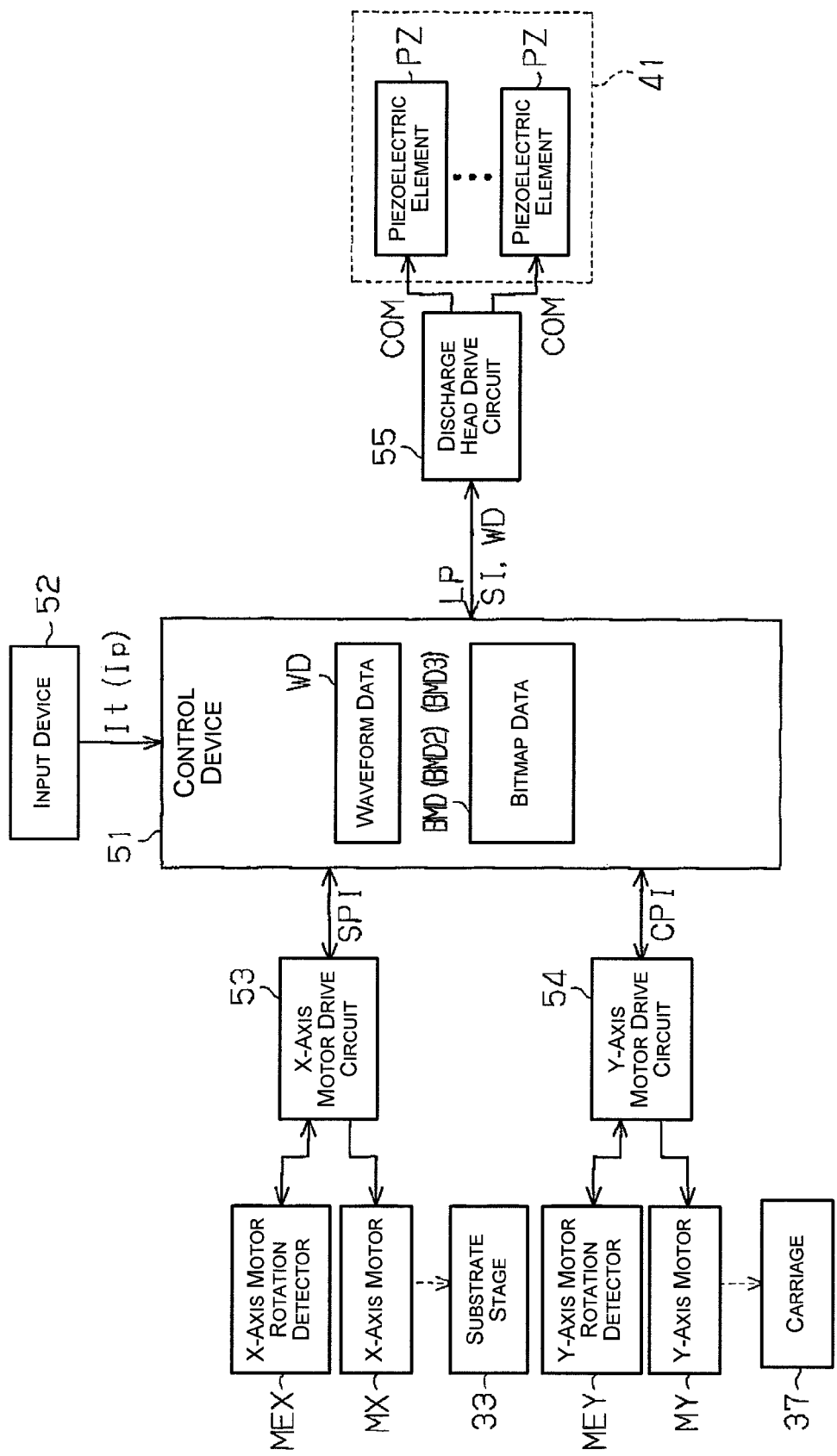
FIG. 10 is an electrical block diagram showing the electrical configuration of the droplet discharge device.

In FIG. 10, a control device 51 is provided with a CPU, RAM, ROM, and the like. The control device 51 causes the substrate stage 33 and the carriage 37 to scan, and performs drive control of the piezoelectric elements PZ of the droplet discharge head 41 in accordance with various types of data and various types of programs stored in the RAM, ROM, or the like.

An input device 52, an X-axis motor drive circuit 53, a Y-axis motor drive circuit 54, and a discharge head drive circuit 55 are connected to the control device 51.

The input device 52 has a start switch, a stop switch, and other operating switches, and is configured so as to input various types of operating signals to the control device 51 and to input information relating to the target thickness of the orientation film 27 formed on the opposing substrate 15 as default-format film thickness information It to the control device 51. The film thickness information It is inputted from the input device 52 to the control device 51. The control device 51 then receives the film thickness information It from the input device 52, computes the total weight of the orientation film formation material F to be discharged on the opposing electrode 26, and computes the discharge interval W (positional coordinates of each target position P) of the droplets Fb on the basis of the computed total weight and the discharged weight of droplets Fb that corresponds to the waveform data WD. When the positional coordinates of each target position P are computed, the control device 51 generates and stores bitmap data BMD for discharging the droplets Fb.

The bitmap data BMD are data in which bit values (0 or 1) are correlated with each target position P on the opposing electrode 26, and are data in which the ON or OFF state of the piezoelectric elements PZ is specified according to the value of each bit. The bitmap data BMD are defined so that a droplet Fb is discharged each time the landing positions PF are positioned at the corresponding target positions P.

The X-axis motor drive circuit 53 responds to drive control signals that correspond to the X-axis motor drive circuit 53 from the control device 51, and causes positive rotation or negative rotation of the X-axis motor MX to move the substrate stage 33 back and forth. An X-axis motor rotation detector MEX is connected to the X-axis motor drive circuit 53, and a detection signal from the X-axis motor rotation detector MEX is inputted. The X-axis motor drive circuit 53 computes the movement direction and amount of movement of the substrate stage 33 (opposing substrate 15) on the basis of the detection signal from the X-axis motor rotation detector MEX, and generates information relating to the current position of the substrate stage 33 as stage position information SPI. The control device 51 receives the stage position information SPI from the X-axis motor drive circuit 53 and outputs various types of signals.

The Y-axis motor drive circuit 54 responds to drive control signals that correspond to the Y-axis motor drive circuit 54 from the control device 51, and causes positive rotation or negative rotation of the Y-axis motor MY for moving the carriage 37 back and forth. A Y-axis motor rotation detector MEY is connected to the Y-axis motor drive circuit 54, and a detection signal from the Y-axis motor rotation detector MEY is inputted. The Y-axis motor drive circuit 54 computes the movement direction and amount of movement of the carriage 37 (droplet discharge device 30) on the basis of the detection signal from the Y-axis motor rotation detector MEY, and generates information relating to the current position of the carriage 37 as carriage position information CPI. The control device 51 receives the carriage position information CPI from the Y-axis motor drive circuit 54 and outputs various types of signals.

More specifically, the control device 51 generates a discharge control signal SI that is synchronized with a prescribed clock signal on the basis of the bitmap data BMD, which correspond to a scanned portion (forward scanning or backward scanning) of the opposing substrate 15 before the opposing substrate 15 passes directly below the carriage 37, on the basis of the stage position information SPI and the carriage position information CPI. The control device 51 is configured so as to sequentially transfer the generated discharge control signal SI in serial fashion to the discharge head drive circuit 55 each time the carriage 37 makes a scan.

The control device 51 is also configured so as to generate a signal (discharge timing signal LP) for outputting the piezoelectric element drive signal COM, which is based on the waveform data WD to the piezoelectric elements PZ each time the landing positions PF are positioned at the corresponding target positions P, on the basis of the stage position information SPI. The control device 51 then sequentially outputs the generated discharge timing signal LP to the discharge head drive circuit 55.

The discharge head 41 is connected to the discharge head drive circuit 55, and the waveform data WD, the discharge control signal SI, and the discharge timing signal LP from the control device 51 are fed to the discharge head drive circuit 55. The discharge head drive circuit 55 receives the discharge control signal SI from the control device 51, correlates the discharge control signal SI with each of the piezoelectric elements PZ, and performs sequential serial/parallel conversion. The discharge head drive circuit 55 feeds the piezoelectric element drive signal COM based on the waveform data WD to the piezoelectric elements PZ on the basis of the serial/parallel-converted discharge control signal SI each time the discharge timing signal LP from the control device 51 is received. Specifically, the discharge head drive circuit 55 feeds the piezoelectric element drive signal COM to the corresponding piezoelectric elements PZ each time the landing positions PF are positioned at the target positions P.

The method for forming the orientation film 27 using the droplet discharge device 30 described above will next be described.

The opposing substrate 15 is first mounted on the substrate stage 33, as shown in FIG. 5. At this time, the substrate stage 33 is positioned further in the minus X-arrow direction than the carriage 37, and the carriage 37 is positioned furthest in the minus Y-arrow direction of the guide member 35.

In this state, the input device 52 is operated, and the film thickness information It is inputted to the control device 51. The control device 51 then generates and stores bitmap data BMD that are based on the film thickness information It.

When the bitmap data BMD are generated, the control device 51 controls the driving of the Y-axis motor MY, and the carriage 37 is positioned and moved. When the opposing substrate 15 is transported in the X-arrow direction, the carriage 37 (nozzles N) is set so that the landing positions PF are positioned on the scanning path (X-arrow direction) of the corresponding target positions P. When the carriage 37 is set, the control device 51 controls the driving of the X-axis motor MX and initiates transport of the substrate stage 33 (opposing substrate 15) in the X-arrow direction.

At this time, the control device 51 synchronizes the waveform data WD with a prescribed clock signal and outputs the waveform data WD to the discharge head drive circuit 55. The control device 51 generates a discharge control signal SI in which the bitmap data BMD corresponding to a single scan of the substrate stage 33 are synchronized with the prescribed clock signal, and sequentially transfers the generated discharge control signal SI in serial fashion to the discharge head drive circuit 55.

Based on the stage position information SPI and the carriage position information CPI, the control device 51 outputs the discharge timing signal LP and executes the droplet discharge operation based on the discharge control signal SI each time that the landing positions PF are positioned at the lattice points (target positions P) on the opposing electrode 26.

Specifically, the control device 51 feeds the piezoelectric element drive signal COM that corresponds to the waveform data WD to the piezoelectric elements PZ, and simultaneously causes the droplets Fb of the orientation film formation material F to be discharged from the nozzles N for which the landing positions PF correspond to the target positions P at the times that the landing positions PF are positioned at the target positions P.

The discharged droplets Fb then travel in the discharge direction A and sequentially land in the regions of the target positions P that are spaced apart at the discharge interval W in the X-arrow direction.

As shown in FIG. 7, the droplets Fb that are landed in the target positions P form droplets Fb1 having a larger diameter (landing diameter R1) on the upper surface of the opposing electrode 26 than the diameter of the droplet Fb in flight. The length of the landing diameter R1 is greater than at least the opposite angle of the second concave parts 26c. The landing diameter R1 is determined by the discharge weight of the droplets Fb, and is determined by the waveform data WD.

As shown in FIG. 8(a), the single landed droplet Fb1 overlaps (straddles over) a plurality of second concave parts 26c, and the center of the droplet Fb1 rises into a half sphere due to surface tension. Since the shape of the droplet Fb1 cannot be maintained by surface tension, the droplet Fb1 spreads in the directions indicated by the arrows inside each second concave part 26c in which the droplet Fb1 has landed. As shown in FIG. 8(b), the droplet Fb1 uniformly spreads inside each second concave part 26c, and a liquid layer Z0 is formed that is temporarily retained by each convex part 26b.

The substantial center of the liquid layer Z0 also rises due to surface tension. In the surface of the liquid layer Z0, the slope of the center portion K (see FIG. 8(b)) that is depressed in an L shape is steeper than that of the rest of the surface. Consequently, the liquid layer Z0 crosses the temporarily retaining convex parts 26b in the directions indicated by the arrows from the center portion K, and spreads in the arrow directions, i.e., towards the adjacent second concave parts 26c in the diagonal directions. As a result, a rectangular liquid layer Z0 is temporarily formed as shown in FIG. 8(c).

The surface of the rectangular liquid layer Z0 forms substantially the same tilt overall, and is therefore easily stabilized. At this time, when the surface of the liquid layer Z0 can be maintained by surface tension, the spreading of the liquid layer Z0 stops. When the surface of the liquid layer Z0 cannot be maintained by surface tension, the liquid layer Z0 spreads to the adjacent second concave parts 26c from all surface portions, and this process repeats until the surface of the liquid layer Z0 is stable.

The sequentially landed droplets Fb become droplets Fb1 having the landing diameter R1 on the upper surface of the opposing electrode 26, but overlap the previously landed droplets Fb1 as shown in FIG. 9(a).

Consequently, when the droplets Fb land on the opposing electrode 26, the droplets make contact with each other and coalesce to form a single liquid layer Z1. As shown in FIG. 9(b), the vicinity of the center of the liquid layer Z1 is more elevated than the edge portion, i.e., the cross-section of the liquid layer Z1 is substantially peak shaped.

Since the center of the liquid layer Z1 is elevated, the liquid layer Z1 spreads into the entire inside portions of the overlapped second concave parts 26c, as shown in FIG. 9(c). Since the discharge quantity of the droplets Fb is large, the vicinity of the center of the liquid layer Z1 rises as shown in FIG. 9(d) even when the liquid layer Z1 spreads into the entire inside portions of the overlapped second concave parts 26c. In this state, the liquid layer Z1 spreads out into the adjacent second concave parts 26c into which the liquid layer Z1 has not yet spread from the side surface portion near the center of the surface. The process is then repeated in which the liquid layer Z1 spreads out into the adjacent second concave parts 26c into which the liquid layer Z1 has not yet spread from the side surface portion near the center of the surface.

When the landing positions PF are positioned at the end portion of the opposing substrate 15 on the scanning path (X-arrow direction) of the corresponding target positions P, the control device 51 controls the driving of the X-axis motor MX, and transport of the substrate stage 33 (opposing substrate 15) in the X-arrow direction is completed.

As shown in FIGS. 9(e) and 9(f), the liquid layer Z1 spread evenly on the entire surface of the opposing electrode 26. The orientation film 27 is then formed when the liquid layer Z1 is dried.

The droplets Fb are thereby joined, and an orientation film 27 having a proper and uniform film thickness can be formed.

Such effects as the following can be obtained through the present embodiment.

(1) According to the present embodiment, second concave parts 26c are formed on the opposing electrode 26. Consequently, the droplets Fb discharged on the opposing electrode 26 can spread into each of the landed second concave parts 26c.

(2) According to the present embodiment, the droplets Fb discharged by the droplet discharge device 30 are droplets that are larger than the volume (capacity C2) of the second concave parts 26c. Consequently, the droplets Fb successively spread into the adjacent second concave parts 26c after spreading in each of the second concave parts 26c in which the droplets are landed. A liquid layer Z1 for forming the orientation film 27 can then be uniformly formed on the entire surface of the opposing electrode 26. As a result, a substantially uniform orientation film 27 can be suitably formed on the upper surface of the opposing electrode 26.

(3) According to the present embodiment, the second concave parts 26c and the convex parts 26b are hydrophilic. Consequently, the liquid layer Z1 is more uniformly formed on the upper surface of the opposing electrode 26.

(4) According to the present embodiment, the droplets Fb landed on the opposing electrode 26 are restricted by the shape of the second concave parts 26c. Consequently, even droplets Fb that land slightly outside the target positions are restricted by the shape of the second concave parts 26c. The effects of landing accuracy on the spreading of the droplets Fb can therefore be reduced. As a result, the structure or system of the droplet discharge device 30 can be simplified.

(5) According to the present embodiment, the second concave parts 26c are partitioned and formed in a matrix. Consequently, the second concave parts 26c for appropriately spreading the droplets Fb have a simple shape, and can therefore be formed relatively easily.

Second Embodiment

The second embodiment as a specific implementation of the present invention will be described hereinafter according to FIGS. 11 through 14. The present embodiment is a method for using a droplet discharge device to form a color filter on the opposing substrate of a liquid crystal panel.

The liquid crystal panel of the present embodiment is a large-sized liquid crystal panel in comparison to the first embodiment, but the structure of the element substrate is substantially the same. The structure of the droplet discharge device used in manufacturing is also substantially the same as that of the droplet discharge device 30 of the first embodiment, and description thereof is therefore omitted. To simplify the description, the reference numerals of the liquid crystal display device 10 of the first embodiment will be used.

Figure 11:
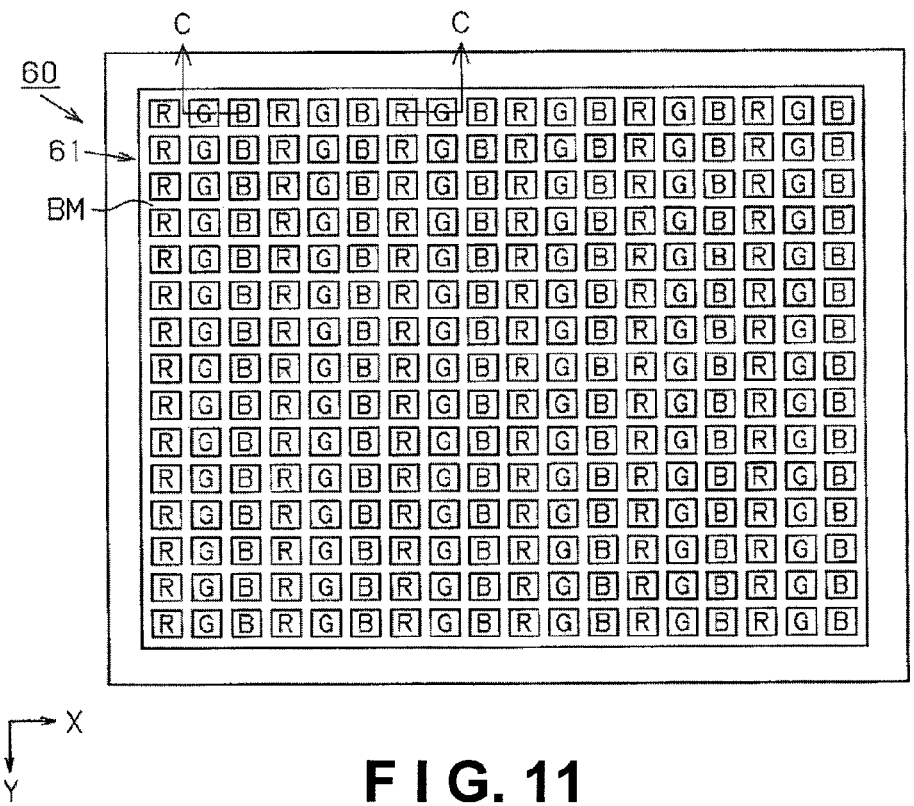
FIG. 11 is a plan view showing the opposing substrate of the second embodiment.
Figure 12:
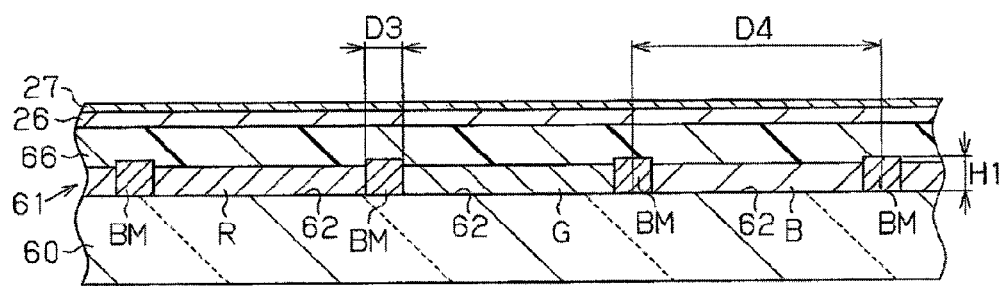
FIG. 12 is a sectional view showing the opposing substrate as viewed from line C-C in FIG. 11.

The opposing substrate 60 will first be described based on FIGS. 11 and 12.

A color filter 61 is formed on the entire surface (surface on the side facing the element substrate 14) of the opposing substrate 60 in the position facing the pixels 22 of the element substrate 14. A lattice-shaped black matrix BM is formed on the color filter 61.

The black matrix BM is formed by layering a light-blocking resin or the like on a chrome film or other light-blocking film. In present embodiment, the black matrix BM is formed so as to have a height H1 of one micrometer or more, and the width D3 of the black matrix BM is about 10 micrometers. The interval D4 of the lattice of the black matrix BM arranged parallel in the X-arrow direction and the Y-arrow direction is about 100 micrometers.

Substantially square frame-shaped filter formation concave parts 62 are formed in the portions surrounded by the black matrix BM. The lengths of the four sides of the filter formation concave parts 62 are each obtained by subtracting the width D3 of the black matrix BM from the interval D4 of the lattice of the black matrix BM, the depth of the filter formation concave parts 62 is one micrometer or more, which is substantially the same as the height H1 of the black matrix BM. The filter formation concave parts 62 are formed in the positions facing the pixel electrodes 23 when the element substrate 14 is affixed.

FIG. 13(a) shows a single filter formation concave part 62. As shown in FIG. 13(a), latticed barriers 63 as convex parts in a lattice are formed on the bottom surface (surface of the opposing substrate 60) of the filter formation concave part 62. In the present embodiment, the latticed barriers 63 are formed so as to have a height of substantially 50 to 60 nanometers, and the interval between the latticed barriers 63 is substantially 10 micrometers.

A square frame-shaped formation concave part 64 is formed in each portion surrounded by the latticed barriers 63. In the present embodiment, the lengths of the four sides of the upper surface of the formation concave parts 64 is substantially 10 micrometers, and the depth of the formation concave parts 64 is 50 to 60 nanometers, which is substantially the same as the height of the latticed barriers 63.

Square frame-shaped red filter layers R, green filter layers G, and blue filter layers B are formed on the filter formation concave part 62 so as to cover the latticed barriers 63 and formation concave parts 64 formed on the bottom surface. In the present embodiment, the lengths of the four sides of the filter layers R, G, B are each substantially 10 micrometers, and the thickness thereof is substantially one micrometer. The filter layers R, G, B are formed in positions corresponding to the pixel electrodes 23 of the element substrate 14. The filter layers R, G, B are formed on the opposing substrate 60 in the repeating sequence of red filter layer R, green filter layer G, and blue filter layer B in the X-arrow direction as shown in FIG. 11, and the filter layers R, filter layers G, and filter layers B are formed in columns of each color in the Y-arrow direction.

A transparent protective film 66 is formed on the upper surface of the color filter 61, and the opposing electrode 26 is formed on the upper surface of the protective film 66. An orientation film 27 on which a rubbing treatment is performed is layered on the upper surface of the opposing electrode 26.

The method for forming the filter layers R, G, B using a droplet discharge device will next be described. Since the droplet discharge device has substantially the same structure as the droplet discharge device 30 shown in FIG. 5, no detailed description thereof will be given. For convenience in the description, the reference numerals of the droplet discharge device 30 shown in FIGS. 5 through 7 and FIG. 10 will be used.

In the droplet discharge device 30 for forming the filter layers R, G, B, the opposing substrate 60 is mounted on the stage 33, and liquid bodies Cr, Cg, Cb as functional liquid bodies in which a color material for forming each filter layer is dispersed in a prescribed dispersing medium are accommodated in the ink tank 38. The liquid bodies Cr, Cg, Cb are hydrophilic with respect to the latticed barriers 63 and the formation concave parts 64. The droplet discharge device 30 is capable of discharging droplets Fb such as the ones shown in FIG. 7 of the liquid bodies Cr, Cg, Cb from the droplet discharge head 41 to the opposing substrate 60. In the present embodiment, the discharge quantity of the droplets Fb is a quantity whereby the droplets Fb landed on the filter formation concave parts 62 spread in the plurality of formation concave parts 64, and is set to 10 picoliters, for example.

The control device 51 is configured so as to arrange the droplets Fb on the basis of bitmap data BMD2 (shown in parentheses in FIG. 10) for forming the filter layers R, G, B in the filter formation concave parts 62 surrounded by the black matrix BM of the opposing substrate 60.

Only the method for forming a filter layer R will be described hereinafter, but the same method is used to form the filter layers G and filter layers B.

As shown in FIG. 13(a), the droplets Fb landed in the target positions of the opposing substrate 60 are arranged as droplets Fb2 having the landing diameter R2 so as to overlap the latticed barriers 63 and the formation concave parts 64. The landed droplets Fb2 also overlap with previously landed droplets Fb2. Consequently, the droplets Fb2 make contact with each other and coalesce upon landing on the filter formation concave part 62, and a single liquid layer Z2 is formed. The vicinity of the center of the liquid layer Z2 at this time is elevated in relation to the edge portion.

Since the center of the liquid layer Z2 is elevated, the liquid layer Z2 spreads into the entire inside portions of the overlapped formation concave parts 64, as shown in FIG. 13(b). Since the discharge quantity of the droplets Fb is large, the vicinity of the center of the liquid layer Z2 rises even when the liquid layer Z2 spreads into the entire inside portions of the overlapped formation concave parts 64. In this state, the liquid layer Z2 spreads out into the adjacent formation concave parts 64 into which the liquid layer Z2 has not yet spread from the portion near the center of the surface. The process is then repeated in which the liquid layer Z2 spreads out into the adjacent formation concave parts 64 into which the liquid layer Z2 has not yet spread from the portion near the center of the surface.

Discharge of the droplets Fb by the droplet discharge device 30 is then completed. The liquid layer Z2 also spreads out uniformly inside the filter formation concave part 62, i.e., the portion surrounded by the black matrix BM, as shown in FIG. 13(c). A red filter layer R is formed when the liquid layer Z2 is dried.

In addition to the effects of the first embodiment, such effects as the following can be obtained through the present embodiment.

(1) According to the present embodiment, the droplets Fb are droplets that are larger than the volume of the formation concave parts 64. Consequently, after the droplets Fb have spread in the concave parts restricted by the formation concave parts 64, the droplets Fb overlap the latticed barriers 63 and successively spread in the adjacent formation concave parts 64. The liquid layer Z2 for forming the filter layers R, G, B can then be uniformly formed in the filter formation concave parts 62. As a result, substantially uniform filter layers R, G, B can be suitably formed in the filter formation concave parts 62.

Third Embodiment

The third embodiment as a specific implementation of the present invention will be described hereinafter.

The third embodiment as a specific implementation of the present invention will be described hereinafter according to FIGS. 14 and 15. The present embodiment is a method for forming the pixel electrodes of the element substrate in the second embodiment using a droplet discharge device. For convenience in the description, the reference numerals of the liquid crystal display device 10 of the first embodiment will be used. The same reference numerals are used for members that are the same as those in the first embodiment, and no description thereof will be given.

FIG. 14 is a sectional view in which the portion of the pixel electrode 23 as conductive wiring in an element substrate 70 is enlarged.

As shown in FIG. 14, an insulation layer 71 as a convex part composed of a silicon oxide film or the like is formed on the upper surface of the element substrate 70 below the pixel electrode 23. As shown in FIG. 15, a plurality of square frame-shaped depressions 72 partitioned and formed in a matrix is formed by etching according to a photolithography method on the upper surface of the insulation layer 71. The lengths of the four sides of the depressions 72 are each substantially 10 micrometers, and the height thereof is 50 to 60 nanometers.

In other words, the pixel electrode 23 is formed by the droplet discharge device 30 so as to cover the depressions 72 formed on the bottom surface on the upper surface of the insulation layer 71.

The method for forming the pixel electrode 23 using the droplet discharge device will next be described. Since the droplet discharge device has substantially the same structure as the droplet discharge device 30 shown in FIG. 5, no detailed description thereof will be given. For convenience in the description, the reference numerals of the droplet discharge device 30 shown in FIGS. 5 through 7 and FIG. 10 will be used.

In the droplet discharge device 30 for forming the pixel electrode 23, the element substrate 70 is mounted on the stage 33 so that the insulation layer 71 faces upward, and ink 73 as a functional liquid material that includes metal microparticles as metal particles for forming the pixel electrode 23, e.g., silver particles, is accommodated in the ink tank 38. The ink 73 is hydrophilic with respect to the insulation layer 71 and the depressions 72. The droplet discharge device 30 is capable of discharging droplets Fb such as the ones shown in FIG. 7 ink 73 from the droplet discharge head 41 to the element substrate 70. The control device 51 is configured so as to arrange the droplets Fb on the basis of bitmap data BMD3 (shown in parentheses in FIG. 10) for forming the pixel electrode 23 on the upper surface of the insulation layer 71 of the element substrate 70. In the present embodiment, the droplets Fb have a liquid quantity whereby the droplets Fb spread only in the depressions 72 in which the droplets Fb are landed, e.g., one picoliter.

The droplets Fb landed in the target positions of the element substrate 70 are arranged as droplets Fb3 having a landing diameter R3 so as to overlap a plurality of depressions 72, as shown in FIG. 15(*a*). The landed droplets Fb3 are landed so that the depressions 72 in which previously landed droplets Fb3 have spread are partially included by the landed depressions 72.

Since the centers of the droplets Fb3 are elevated, the droplets Fb3 spread in the entire inside portions of the landed depressions 72. However, since the discharge quantity of the discharged droplets Fb is small, the droplets Fb do not spread in depressions 72 other than the depressions 72 in which the droplets Fb are initially landed. In other words, the droplets Fb3 make contact and coalesce with other droplets Fb3 to form a liquid layer Z3 as shown in FIG. 15(*b*) in depressions 72 that are common to adjacent droplets Fb3, but the liquid layer Z3 does not spread out to other depressions 72.

When discharge of the droplets Fb by the droplet discharge device 30 is completed, the liquid layer Z3 spreads only into the depressions 72 in which the landed droplets Fb3 are arranged. In other words, the liquid layer Z3 is formed in the shape of wiring or a film set according to wiring coordinate information Ip (shown in parentheses in FIG. 10), and the prescribed shape of pixel electrode 23 is formed when the liquid layer Z3 is dried.

In addition to the effects of the first embodiment and the second embodiment, such effects as the following can be obtained through the present embodiment.

(1) According to the present embodiment, the droplets Fb are larger than the volume of the depressions 72, but the droplets do not spread beyond the depressions 72. Accordingly, the droplets Fb are restricted by the depressions 72 in which the droplets Fb are landed, and spread in the concave parts, and do not spread out in the landed form thereof. As a result, the pixel electrode 23 can be formed in the pattern shape of the droplets discharged by the droplet discharge device 30. As a result, a pixel electrode 23 that is formed in the correct pattern can be formed in a prescribed shape on the upper surface of the insulation layer 71.

(2) According to the present embodiment, the droplets Fb are hydrophilic with respect to the insulation layer 71 and the depressions 72. Consequently, the liquid layer Z3 formed so as to overlap the depressions 72 is not interrupted between one depression 72 and the next, and the pixel electrode 23 can be suitably formed.

The embodiments described above may be modified as described below.

In the embodiments described above, the droplet discharge device 30 discharged the droplets Fb and formed a pattern of the functional liquid material after the second concave parts 26*c* on the opposing substrate 15 of the liquid crystal display device, the formation concave parts 64 on the opposing substrate 60, and the depressions 72 on the element substrate 70 were each partitioned and formed in a matrix. However, this configuration is not limiting, and the pattern may be formed on any substrate insofar as the substrate is provided with concave parts for forming the pattern. For example, the substrate may be the element substrate or opposing substrate of an organic electroluminescence device, an electrophoresis display device, or the like as an electro-optical device other than a liquid crystal display device.

In the embodiments described above, an orientation film 27 was formed on the opposing substrate 15, filter layers R, G, B were formed on the opposing substrate 60, and the pixel electrode 23 was formed on the element substrate 70 by the droplet discharge device 30. However, this configuration is not limiting, and a wiring pattern may be formed on a film or layer other than the opposing substrates 15, 60 and the element substrate 70.

In the embodiments described above, the concave parts 27c, 64 and the depressions 72 were partitioned in a matrix and formed in a substantially square frame shape. However, this configuration is not limiting, and the concave parts 28c, 64 and the depressions 72 may be formed in a polygonal shape or a mosaic when the concave 28c, 64 and the depressions 72 are formed adjacent to each other.

In the embodiments described above, the liquid quantity of one droplet Fb was greater than the volume (capacity) of a single concave part 28c, 64 or depression 72. However, this configuration is not limiting, the droplets Fb may have a liquid quantity less than the volume (capacity) of a single concave part 28c, 64 or depression 72. In this case, a configuration may be adopted in which a plurality of droplets Fb is merged to form large liquid layers Z1, Z2, Z3, and the liquid layers Z1, Z2, Z3 are formed so as to overlap the concave parts 28c, 64 or depressions 72. A pattern can thereby be formed even on a substrate that is provided with large concave parts 28c, 64 or depressions 72.

In the embodiments described above, the height of the latticed barriers 28b was lower than that of the frame-shaped barrier 28a, but this configuration is not limiting, and the height of the latticed barriers 28b may be the same as or higher than that of the outer frame. The interval of the latticed barriers 28b was also formed so as to be substantially 10 micrometers, but the interval is not limited to 10 micrometers. Furthermore, the width of the latticed barriers 28b was set to one to two micrometers, but the width is not limited to one to two micrometers.

In the embodiments described above, the liquid quantity of the droplets Fb was set to 10 picoliters in the first and second embodiments, and one picoliter in the third embodiment. However, the liquid quantities of the droplets Fb may be greater than or less than the liquid quantities in each embodiment.

The liquid quantity of the droplets Fb may be a quantity that enables the droplets Fb to suitably spread out on the surface on which the droplets Fb are discharged, according to the relationship between the surface tension of the droplets Fb, the ease of spreading of the droplets Fb on the discharged surface, and the size of the banks formed on the discharged surface.

In the embodiments described above, the droplets Fb were discharged using the droplet discharge device 30. However, this configuration is not limiting, and a dispenser, for example, may be used insofar as the dispenser is configured so as to be capable of discharging the prescribed liquid quantity of droplets Fb in prescribed locations of the substrate.

In the first and second embodiments, subsequently landed droplets Fb partially overlapped the previously landed droplets Fb. However, this configuration is not limiting, and the subsequently landed droplets Fb may be landed so as not to overlap with the previously landed droplets Fb. In this case, the droplets Fb may be allowed to come in contact with other droplets Fb when droplets Fb subsequently spread out.

In the second embodiment, the black matrix BM was formed by layering a resin or the like on a chrome film or other film. However, this configuration is not limiting, and the black matrix BM may be formed only by a resin, or only by a chrome film.

In the first and second embodiments, the frame-shaped barrier 28a, the latticed barriers 28b, and the latticed barriers 63 were formed using polyimide resin and acrylic resin. However, this configuration is not limiting, and a light-transmitting resin composed of fluorinated resin or the like that is hydrophobic with respect to the functional liquid material may also be used.

In the third embodiment, the depressions 72 were formed on the upper surface of the insulation layer 71 formed by a silicon oxide film or the like. However, this configuration is not limiting, and the upper surface of the insulation layer 71 may be treated so as to be hydrophobic with respect to the functional liquid material. The functional liquid material can thereby be arranged only in the portions corresponding to the depressions 72.

GENERAL INTERPRETATION OF TERMS

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A pattern formation method comprising:
    forming a frame barrier on a substrate and forming a plurality of latticed barriers within the frame barrier so that a height of the frame barrier is greater than a height of the latticed barriers as measured from the substrate with the latticed barriers partitioning a plurality of concave parts formed in a matrix; and
    discharging a functional liquid material on the substrate so that the functional liquid material is placed in at least two selected concave parts adjacent to each other among the concave parts and continuously spreads over the at least two selected concave parts to form a prescribed pattern of the functional liquid material within the frame barrier on the substrate.

2. The pattern formation method according to claim 1, wherein
    the discharging of the functional liquid material includes discharging droplets of the functional liquid material on the substrate by a droplet discharge device.

3. The pattern formation method according to claim 2, wherein
    the discharging of the droplets includes discharging the droplets so that a subsequently discharged droplet at least partially overlaps with a previously discharged droplet that was discharged on the substrate.

4. The pattern formation method according to claim 2, wherein
the discharging of the droplets includes discharging the droplets so that at least a portion of a first droplet is arranged in the concave part in which at least a portion of a second droplet that is discharged separately from the first droplet is also arranged.

5. The pattern formation method according to claim 1, wherein
the forming of the concave parts includes forming the concave parts to be hydrophilic with respect to the functional liquid material.

6. The pattern formation method according to claim 1, wherein
the forming of the concave parts includes forming a part of the latticed barriers as a convex part between adjacent ones of the concave parts with the convex parts being hydrophobic with respect to the functional liquid material.

7. The pattern formation method according to claim 1, further comprising
forming the substrate as one of an element substrate and an opposing substrate of a liquid crystal display device,
the discharging of the functional liquid material including discharging the functional liquid material that includes an oriented polymer for forming an orientation film.

8. The pattern formation method according to claim 1, further comprising
forming the substrate as an opposing substrate of a liquid crystal display device,
the discharging of the functional liquid material including discharging the functional liquid material that includes a color material for forming a color filter.

9. The pattern formation method according to claim 1, further comprising
forming the substrate as one of an element substrate and an opposing substrate of a liquid crystal display device,
the discharging of the functional liquid material including discharging the functional liquid material that includes metal particles for forming conductive wiring.

* * * * *